(12) United States Patent
Myong et al.

(10) Patent No.: US 7,049,902 B2
(45) Date of Patent: May 23, 2006

(54) TUNABLE HIGH-ORDER BESSEL LOW PASS FILTER

(75) Inventors: Seung Il Myong, Daejeon (KR); Kwang Joon Kim, Daejeon (KR); Jyung Chan Lee, Daejeon (KR); Sang Kyu Lim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 70 days.

(21) Appl. No.: 10/858,925

(22) Filed: Jun. 1, 2004

(65) Prior Publication Data

US 2005/0134398 A1 Jun. 23, 2005

(30) Foreign Application Priority Data

Dec. 18, 2003 (KR) .................. 10-2003-0092822

(51) Int. Cl.
*H03H 7/01* (2006.01)
*H03J 3/00* (2006.01)
*H03J 7/02* (2006.01)

(52) U.S. Cl. ..................... 333/17.1; 333/174
(58) Field of Classification Search ............. 333/17.1, 333/174

See application file for complete search history.

(56) References Cited

U.S. PATENT DOCUMENTS 5,422,607 A * 6/1995 McEwan ............... 333/20
5,917,387 A * 6/1999 Rice et al. ............. 333/174

(Continued)

FOREIGN PATENT DOCUMENTS

JP 10112625 4/1998

KR 10-2002-0071656 A 9/2002
KR 10-2003-0075421 A 9/2003

(Continued)

OTHER PUBLICATIONS

Hoon Kim et al., "Optical Duobinary Transmission System Featuring Improved Receiver Sensitivity and Reduced Optical Bandwidth", IEEE Photonics Technology Letters, vol. 14, No. 8, Aug. 2002 (pp. 1205-1207).

(Continued)

*Primary Examiner*—Barbara Summons
(74) *Attorney, Agent, or Firm*—Blakely Sokoloff Taylor & Zafman

(57) ABSTRACT

A tunable high-order Bessel low pass filter which is applied to a multi-rate duobinary generation system of an optical communication system. The tunable Bessel low pass filter comprises a variable inductor circuit including a plurality of variable inductors connected in series between an input signal terminal and an output signal terminal and controlled respectively by corresponding inductance control signals, a variable capacitor circuit including a plurality of variable capacitors connected respectively between corresponding connection nodes of the plurality of variable inductors of the variable inductor circuit and a ground terminal and controlled respectively by corresponding capacitance control signals, and a variable capacitor/inductor controller for outputting the corresponding capacitance control signals to the variable capacitors of the variable capacitor circuit and the corresponding inductance control signals to the variable inductors of the variable inductor circuit on the basis of preset values according to a given data rate, respectively. When the data rate of an application system is changed, the tunable Bessel low pass filter controls its filtering characteristics most appropriately to the changed data rate, so as to extend its application range and enhance performance and efficiency of the application system.

3 Claims, 5 Drawing Sheets

U.S. PATENT DOCUMENTS

| | | | | |
|---|---|---|---|---|
| 6,307,442 | B1 | 10/2001 | Meyer et al. | 333/17.1 |
| 6,453,157 | B1 | 9/2002 | Roberts | 455/337 |
| 6,686,809 | B1 * | 2/2004 | Nystrom et al. | 333/17.1 |

FOREIGN PATENT DOCUMENTS

| | | |
|---|---|---|
| KR | 2003-0077405 | 10/2003 |

OTHER PUBLICATIONS

J.M. Gene et al., "Reduced Driving Voltage Optical Duobinary Transmitter and Its Impact on Transmission Performance Over Standard Single-Mode Fiber", IEEE Photonics Technology Letters, Vo. 14, No. 6, Jun. 2002 (pp. 843-845).

* cited by examiner

TUNABLE HIGH-ORDER BESSEL LOW PASS FILTER

BACKGROUND OF THE INVENTION

1. Field of the Invention

The present invention relates to a tunable Bessel low pass filter which is applied to a multi-rate duobinary generation system of an optical communication system, and more particularly to a tunable high-order Bessel low pass filter which is capable of, when the data rate of an application system is changed, controlling its filtering characteristics most appropriately to the changed data rate, thereby extending its application range and enhancing performance and efficiency of the application system.

2. Description of the Related Art

In general, an optical communication system comprises an optical transmission system including an optical transmitter for converting an electrical signal into an optical signal, an optical fiber cable for transmitting the optical signal from the optical transmitter, a repeater for amplifying and transmitting the optical signal from the optical fiber cable in the middle of its transmission by the cable, and an optical receiver for converting the optical signal amplified and transmitted by the repeater back into an electrical signal. Such an optical communication system of the 10 Gbps class has various data rates, including 12.5 Gbps, based on standardization of optical transmission networks, resulting in a need for electronic devices for generation of the corresponding signals to have tunable ranges.

FIG. 1 is a block diagram showing the configuration of a general duobinary generation system.

With reference to FIG. 1, the general duobinary generation system comprises a data signal or pulse pattern generator 111 (referred to hereinafter as a 'data signal generator') for generating data or a pulse pattern, a precoder 112 for exclusive-ORing an electrical data signal from the data signal generator 111 and a 1 bit-delayed version of the data signal to code the data signal, a fixed Bessel low pass filter 113 for low pass filtering an output electrical signal from the precoder 112, an amplifier 114 for amplifying an output electrical signal from the fixed Bessel low pass filter 113 at a predetermined gain, and an optical modulator 116 for modulating light generated by a laser diode 115 into an optical duobinary signal on the basis of an output signal from the amplifier 114.

On the other hand, the above-mentioned duobinary generation system may transmit data at multiple rates, such as 10 Gbps, 12.5 Gbps, etc., according to transmission environments or data types. At this time, the data transmission must be made with no signal loss irrespective of a change in data rate. However, since a conventional fixed fifth-order Bessel low pass filter, such as the fixed Bessel low pass filter 113, is implemented in an appropriate manner to a specific data rate, it must be replaced with a different one upon occurrence of a change in data rate, as will hereinafter be described with reference to FIG. 2.

FIG. 2 is a block diagram showing the configuration of the conventional fixed fifth-order Bessel low pass filter 113.

With reference to FIG. 2, the conventional fixed fifth-order Bessel low pass filter 113 functions to filter an input signal Sin to pass a low-frequency component thereof and cut off a high-frequency component thereof containing an unnecessary noise component. To this end, the fixed Bessel low pass filter 113 includes a plurality of fixed capacitors C1–C3 and a plurality of fixed inductors L1 and L2.

This conventional fixed fifth-order Bessel low pass filter has a disadvantage in that it is not operable adaptively to a change in data rate because it is designed and used in an appropriate manner to a specific data rate. For example, in the case where the low pass filter filters a lower-rate signal under condition of having higher passband characteristics, it distorts the signal, resulting in signal loss. Similarly, in the case of filtering a higher-rate signal under condition of having lower passband characteristics, the low pass filter distorts the signal, resulting in signal loss.

That is, the conventional fixed fifth-order Bessel low pass filter has a '−3 dB' cut-off frequency corresponding to the specific data rate. For this reason, provided that the data rate is changed, the conventional fixed fifth-order Bessel low pass filter must be replaced with a different one.

In other words, the conventional fixed fifth-order Bessel low pass filter can perform an appropriate filtering function required by the system with respect to one specific data rate, but cannot perform it due to signal distortion, etc. with respect to a different data rate. For this reason, there is a problem in that the conventional fixed fifth-order Bessel low pass filter must be replaced with a different one appropriate to the different data rate, or the system to which it is applied must be replaced with a different one.

SUMMARY OF THE INVENTION

Therefore, the present invention has been made in view of the above problems, and it is an object of the present invention to provide a tunable high-order Bessel low pass filter which is capable of, when the data rate of an application system is changed, controlling its filtering characteristics most appropriately to the changed data rate, thereby extending its application range and enhancing performance and efficiency of the application system.

In accordance with the present invention, the above and other objects can be accomplished by the provision of a tunable Bessel low pass filter comprising: a variable inductor circuit including a plurality of variable inductors connected in series between an input signal terminal and an output signal terminal and controlled respectively by corresponding inductance control signals; a variable capacitor circuit including a plurality of variable capacitors connected respectively between corresponding connection nodes of the plurality of variable inductors of the variable inductor circuit and a ground terminal and controlled respectively by corresponding capacitance control signals; and a variable capacitor/inductor controller for outputting the corresponding capacitance control signals to the variable capacitors of the variable capacitor circuit and the corresponding inductance control signals to the variable inductors of the variable inductor circuit on the basis of preset values according to a given data rate, respectively.

Preferably, the plurality of variable inductors of the variable inductor circuit may be two in number, and the plurality of variable capacitors of the variable capacitor circuit may be three in number, whereby the tunable Bessel low pass filter is of a tunable fifth-order Bessel type.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
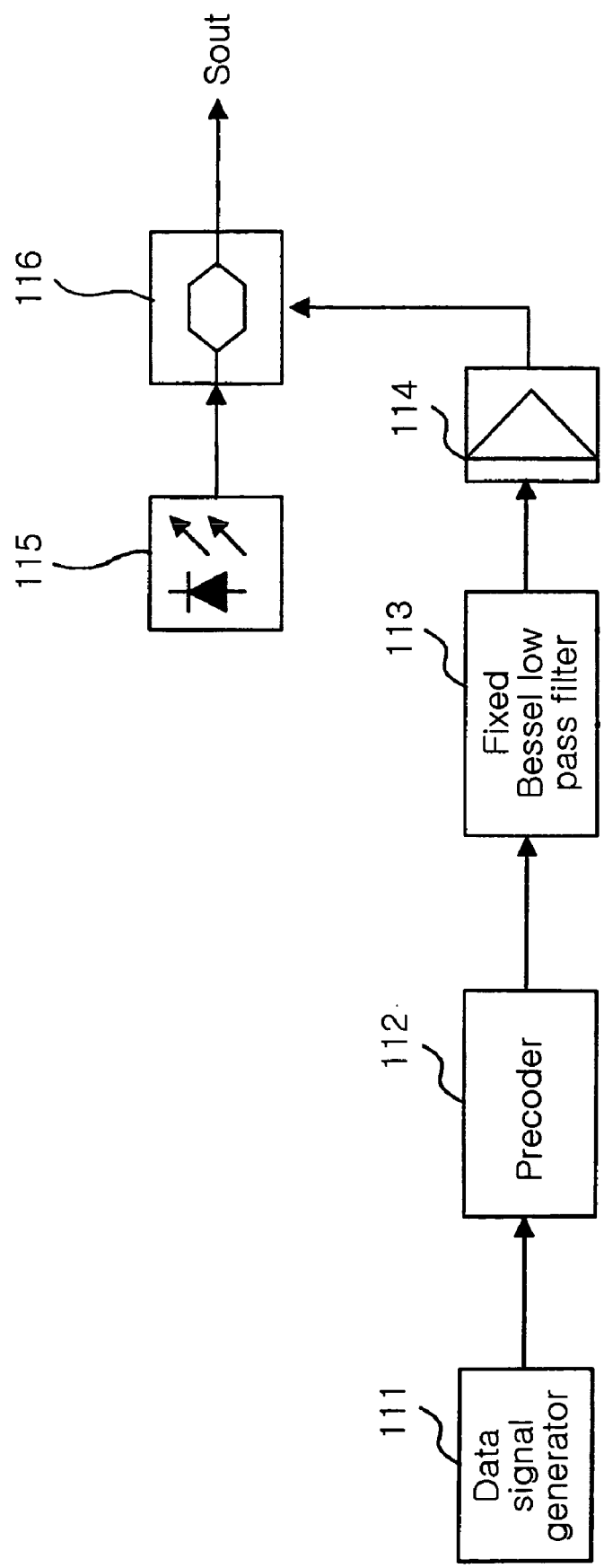
FIG. 1 is a block diagram showing the configuration of a general duobinary generation system.
Figure 2:
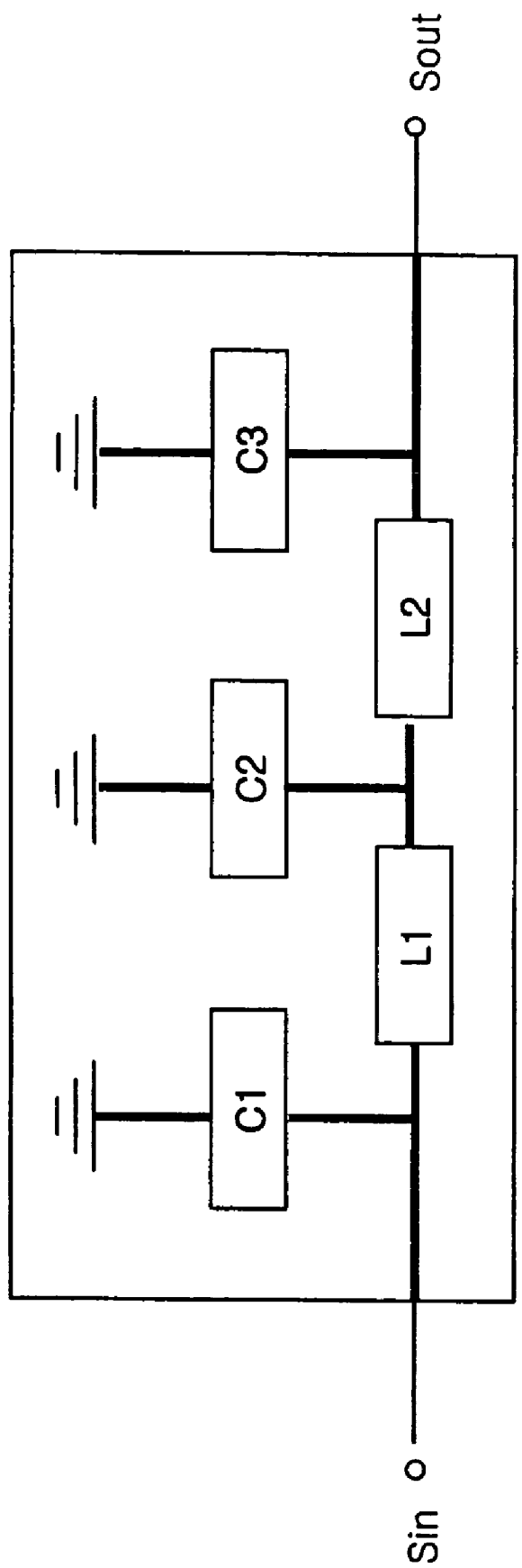
FIG. 2 is a block diagram showing the configuration of a conventional fixed fifth-order Bessel low pass filter.

Now, preferred embodiments of the present invention will be described in detail with reference to the annexed drawings. In the drawings, the same or similar elements are denoted by the same reference numerals even though they are depicted in different drawings.

Figure 3:
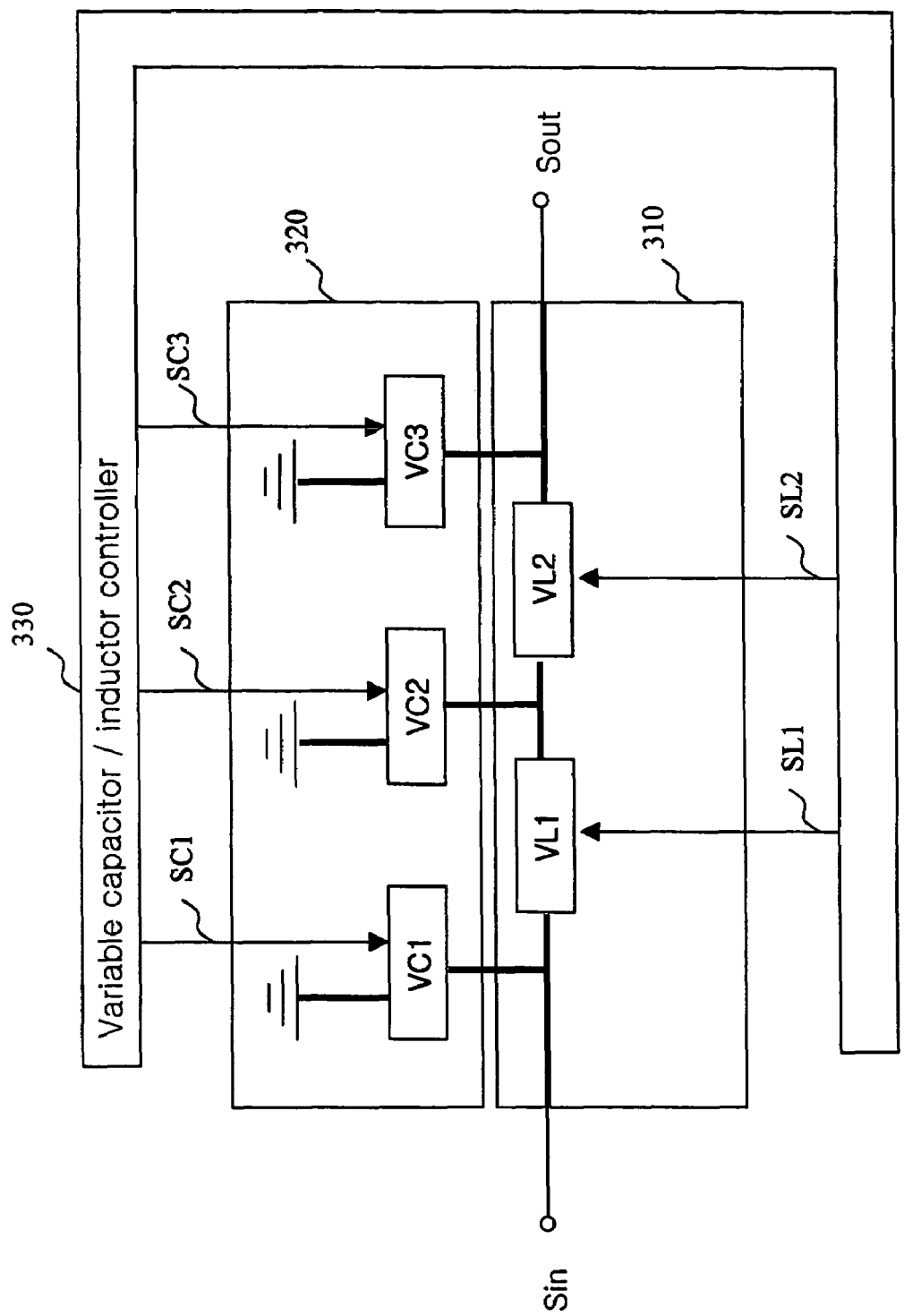
FIG. 3 is a block diagram showing the configuration of a tunable high-order Bessel low pass filter according to the present invention.

FIG. 3 is a block diagram showing the configuration of a tunable high-order Bessel low pass filter according to the present invention.

With reference to FIG. 3, the tunable high-order Bessel low pass filter according to the present invention comprises a variable inductor circuit 310 including a plurality of variable inductors connected in series between an input signal Sin terminal and an output signal Sout terminal and controlled respectively by corresponding inductance control signals, a variable capacitor circuit 320 including a plurality of variable capacitors connected respectively between corresponding connection nodes of the plurality of variable inductors of the variable inductor circuit 310 and a ground terminal and controlled respectively by corresponding capacitance control signals, and a variable capacitor/inductor controller 330 for outputting the corresponding capacitance control signals to the variable capacitors of the variable capacitor circuit 320 and the corresponding inductance control signals to the variable inductors of the variable inductor circuit 310 on the basis of preset values according to a given data rate, respectively.

In a preferred embodiment of the present invention, the variable inductor circuit 310 includes two variable inductors, first and second variable inductors VL1 and VL2, connected in series between the input signal Sin terminal and the output signal Sout terminal, and the variable capacitor circuit 320 includes three variable capacitors, first to third variable capacitors VC1, VC2 and VC3, connected respectively between corresponding connection nodes of the first and second variable inductors VL1 and VL2 of the variable inductor circuit 310 and the ground terminal. Therefore, the tunable Bessel low pass filter according to the present invention is of a tunable fifth-order Bessel type.

The connection nodes of the first and second variable inductors VL1 and VL2 of the variable inductor circuit 310 are a connection node between the input signal Sin terminal and the first variable inductor VL1, a connection node between the first variable inductor VL1 and the second variable inductor VL2, and a connection node between the second variable inductor VL2 and the output signal Sout terminal.

The variable inductors and/or variable capacitors applied to the present invention are tunable devices with inductances and/or capacitances tunable by electrical control signals, which are preferably MEMS (Micro Electro Mechanical System) structure devices in terms of size.

Figure 4:
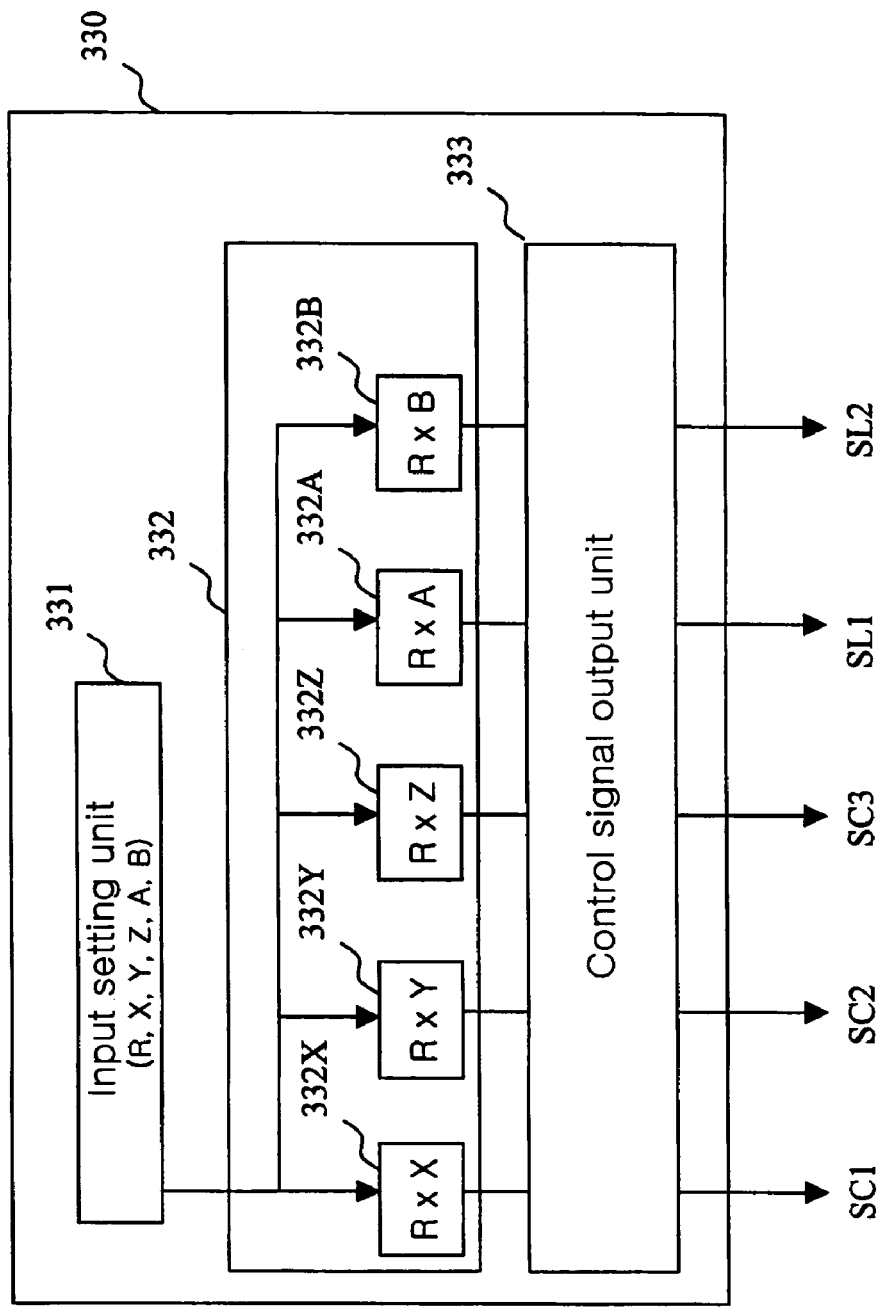
FIG. 4 is a block diagram showing the configuration of a variable capacitor/inductor controller according to the present invention.

The capacitor/inductor controller 330 can generate the variable capacitor/variable inductor control signals in the form of mechanical or electrical signals, so it can be a mechanical or electrical controller, which may be implemented as shown in FIG. 4, for example.

FIG. 4 is a block diagram showing the configuration of the variable capacitor/inductor controller 330 according to the present invention.

The capacitor/inductor controller 330 is adapted to control the plurality of variable capacitors VC1, VC2 and VC3 of the variable capacitor circuit 320 and the plurality of variable inductors VL1 and VL2 of the variable inductor circuit 310. To this end, the capacitor/inductor controller 330 includes, as shown in FIG. 4, an input setting unit 331 for presetting a reference value R and a plurality of multiplication factors X, Y, Z, A and B to be applied to the reference value R, a multiplication unit 332 including a plurality of multipliers 332X, 332Y, 332Z, 332A and 332B for multiplying the reference value R by the multiplication factors X, Y, Z, A and B, respectively, and a control signal output unit 333 for converting the results of multiplication by the multiplication unit 332 into capacitance/inductance control signals SC1–SC3, SL1 and SL2 and outputting them respectively to the variable capacitors VC1, VC2 and VC3 of the variable capacitor circuit 320 and the variable inductors VL1 and VL2 of the variable inductor circuit 310.

A detailed description will hereinafter be given of the operation of the tunable high-order Bessel low pass filter with the above-stated configuration according to the present, invention in conjunction with the annexed drawings.

First, with reference to FIG. 3, an input signal Sin is filtered through a filter circuit, which consists of the variable capacitor circuit 320 and the variable inductor circuit 310, and then provided as an output signal Sout. At this time, the input signal Sin is passed at a low passband that is defined depending on the inductance of the variable inductor circuit 310 and the capacitance of the variable capacitor circuit 320.

Here, a cut-off frequency Fc defining the low passband is a frequency at which gain is lower by '3 dB' than that at a reference frequency of the passband. In the tunable high-order Bessel low pass filter according to the present invention, the cut-off frequency Fc is determined depending on the equivalent capacitance CT of the variable capacitor circuit 320 and the equivalent inductance LT of the variable inductor circuit 310, as can be expressed by the below equation 1:

$$Fc = \frac{1}{2\pi\sqrt{LT * CT}} \qquad \text{[Equation 1]}$$

As seen from the above equation 1, in the tunable high-order Bessel low pass filter according to the present invention, the cut-off frequency Fc varies with a variation in the equivalent capacitance CT of the variable capacitor circuit 320 and/or the equivalent inductance LT of the variable inductor circuit 310.

According to the present invention, the capacitor/inductor controller 330 outputs the corresponding capacitance control signals to the plurality of variable capacitors of the variable capacitor circuit 320 and the corresponding inductance control signals to the plurality of variable inductors of the variable inductor circuit 310 on the basis of preset values according to a given data rate, respectively.

For example, the tunable high-order Bessel low pass filter of the present invention has the best frequency characteristics when it is implemented as a tunable fifth-order Bessel low pass filter as shown in FIG. 3 in the case of being applied to a multi-rate duobinary generation system of an optical communication system. Where the tunable high-order Bessel low pass filter of the present invention is implemented as a tunable fifth-order Bessel low pass filter, the variable inductor circuit 310 includes the two variable inductors, first and second variable inductors VL1 and VL2, connected in series between the input signal Sin terminal and the output signal Sout terminal, and the variable capacitor circuit 320 includes the three variable capacitors, first to third variable capacitors VC1, VC2 and VC3, connected respectively between the corresponding connection nodes of the first and second variable inductors VL1 and VL2 of the variable inductor-circuit 310 and the ground terminal.

With reference to FIG. 4, in order to control the plurality of variable capacitors VC1, VC2 and VC3 of the variable capacitor circuit 320 and the plurality of variable inductors VL1 and VL2 of the variable inductor circuit 310, the input setting unit 331 in the capacitor/inductor controller 330 presets a reference value R and a plurality of multiplication factors X, Y, Z, A and B to be applied to the, reference value R, and the multipliers 332X, 332Y, 332Z, 332A and 332B of the multiplication unit 332 in the capacitor/inductor controller 330 multiply the reference value R by the multiplication factors X, Y, Z, A and B, respectively, and apply the multiplication results to the control signal output unit 333.

The control signal output unit 333 in the variable capacitor/inductor controller 330 converts the multiplication results from the multiplication unit 332 into capacitance/inductance control signals SC1–SC3 , SL1 and SL2 and outputs them respectively to the variable capacitors VC1, VC2 and VC3 of the variable capacitor circuit 320 and the variable inductors VL1 and VL2 of the variable inductor circuit 310.

As a result, the capacitances of the three variable capacitors of the variable capacitor circuit 320 and the inductances of the two variable inductors of the variable inductor circuit 310 are changed, so that the cut-off frequency is changed appropriately to a given data rate.

On the other hand, the capacitance/inductance control signals SC1–SC3 , SL1 and SL2 shown in FIG. 4 are generated in the following manner according to the present invention, for example, for change of the cut-off frequency of the fifth-order Bessel low pass filter from fc1 to fc2. Assume that the set capacitance values of the variable capacitor circuit 320 and the set inductance values of the variable inductor circuit 310 corresponding to the cut-off frequency fc1 are 'C1fc1, C2fc1, C3fc1, L1fc1 and L2fc1', respectively, and the set capacitance values of the variable capacitor circuit 320 and the set inductance values of the variable inductor circuit 310 corresponding to the cut-off frequency fc2 are 'C1fc2, C2fc2, C3fc2, L1fc2 and L2fc2', respectively. In this case, if the variation of C1fc2−C1fc1 is x, the variation of C2fc2−C2fc1 is y, the variation of C3fc2−C3fc1 is z, the variation of L1fc2−L1fc1 is a, and the variation of L2fc2−L2fc1 is b, then the relative variation ratio of C1 to C2 is y/x=Y, the relative variation ratio of C1 to C3 is z/x=Z, the relative variation ratio of C1 to L1 is a/x=A, and the relative variation ratio of C1 to L2 is b/x=B. These relative variation ratios are set as multiplication factors.

Since the multiplication factors are constantly applied irrespective of cut-off frequency changes, a desired cut-off frequency value can be obtained by changing the reference value R once the multiplication factors X, Y, Z, A and B are preset by the input setting unit 331. The control signal output unit 333 outputs the multiplication results R*X, R*Y, R*Z, R*A and R*B based on the respective multiplication factors from the multipliers 332X, 332Y, 332Z, 332A and 332B, respectively, as the control signals SC1–SC3 , SL1 and SL2. Therefore, for change of the cut-off frequency, the variable capacitors and the variable inductors can be controlled at the same time by changing one reference value under the condition of presetting the multiplication factors.

For example, a 2.4 to 3.8 GHz tunable fifth-order Bessel low pass filter is required to generate an optical duobinary signal of 10 to 12.5 Gbps, a specific data rate range of the 10 Gbps class. The optimum '−3 dB' cut-off frequency corresponding to a specific data rate is obtained depending on the respective control signals SC1–SC3 , SL1 and SL2.

That is, if the data rate becomes higher, it is necessary to linearly reduce the capacitances of the variable capacitors VC1–VC3 in order to obtain the optimum '−3 dB' cut-off frequency corresponding to the data rate. In this case, since the respective relative variation ratios of the variable capacitors are constant, it is possible to simultaneously control the variable capacitors VC1–VC3 with the control signals SC1–SC3 . Further, the inductances of the variable inductors VL1 and VL2 must be linearly reduced with the increase in data rate. In this case, since the respective relative variation ratios of the variable inductors are constant, it is possible to simultaneously control the variable inductors VL1 and VL2 with the control signals SL1 and SL2.

As described above, the optimum cut-off frequency of the Bessel low pass filter corresponding to a specific data rate can be easily obtained on the basis of the control signals SC1–SC3 , SL1 and SL2, so the Bessel low pass filter of the present invention is available through the simple reference value change even though the data rate is changed.

Figure 5:
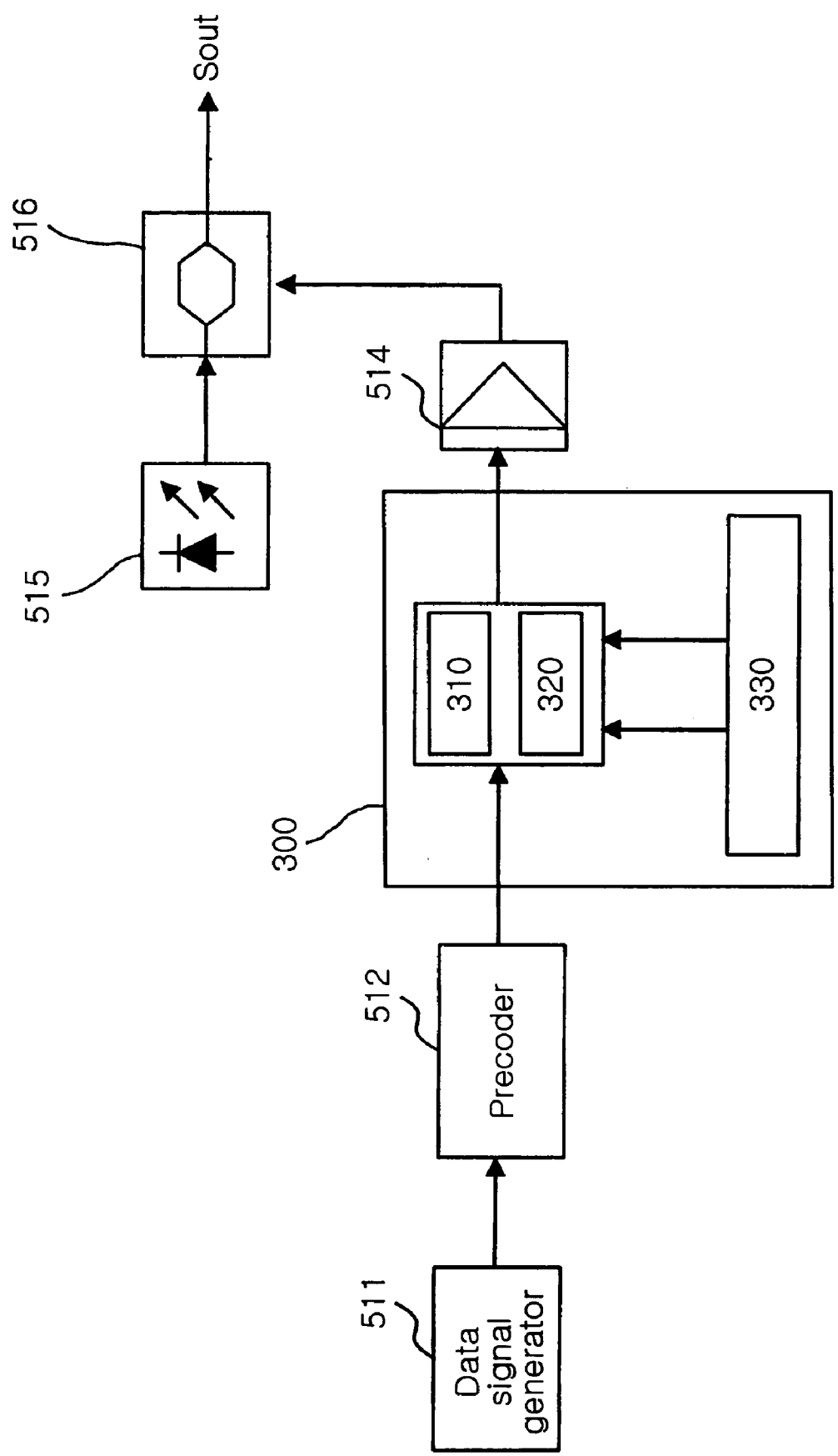
FIG. 5 is a block diagram showing the configuration of a duobinary generation system to which a tunable fifth-order Bessel low pass filter according to the present invention is applied.

FIG. 5 is a block diagram showing the configuration of a duobinary generation system to which the tunable fifth-order Bessel low pass filter according to the present invention is applied.

With reference to FIG. 5, the duobinary generation system generates an optical duobinary signal in the same manner as in a conventional system, with the exception of using the fifth-order Bessel low pass filter shown in FIG. 3. The tunable fifth-order Bessel low pass filter is used to change a '−3 dB' cut-off frequency thereof with a change in data rate between 10 Gbps and 12.5 Gbps, resulting in the advantage of being able to generate the optimum optical duobinary signal adaptively to the data rate. Further, there is another advantage in that it is possible to correct a fine data rate error between the data rate and the fixed fifth-order Bessel low pass filter.

The optical communication system to which the present invention is applied, as described above, may include an optical transmitter, an optical receiver, an optical transmission medium and so forth, and the present invention is applicable to all systems capable of processing optical signals, as well as the optical communication system.

As apparent from the above description, the present invention provides a tunable Bessel low pass filter which is applied to a multi-rate duobinary generation system of an optical communication system. This tunable Bessel low pass filter is capable of, when the data rate of an application system is changed, controlling its filtering characteristics most appropriately to the changed data rate, thereby extending its application range and enhancing performance and efficiency of the application system.

Provided that an optical duobinary signal generator employs a tunable fifth-order Bessel low pass filter of the present invention, it will have data rate adaptability based on tunability of the filter, so as to maximize efficiency and performance of the multi-rate optical duobinary signal generation.

The tunable fifth-order Bessel low pass filter of the present invention is useful to the multi-rate optical duobinary signal generation and tunable to be optimized to a given data rate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A tunable Bessel low pass filter comprising:
    a variable inductor circuit including a plurality of variable inductors connected in series between an input signal terminal and an output signal terminal and controlled respectively by corresponding inductance control signals;
    a variable capacitor circuit including a plurality of variable capacitors connected respectively between corresponding connection nodes of said plurality of variable inductors of said variable inductor circuit and a ground terminal and controlled respectively by corresponding capacitance control signals; and
    a variable capacitor/inductor controller for outputting the corresponding capacitance control signals to said variable capacitors of said variable capacitor circuit and the corresponding inductance control signals to said variable inductors of said variable inductor circuit on the basis of preset values according to a given data rate, respectively.

2. The tunable Bessel low pass filter as set forth in claim 1, wherein:
    said plurality of variable inductors of said variable inductor circuit are two in number; and
    said plurality of variable capacitors of said variable capacitor circuit are three in number;
    whereby said tunable Bessel low pass filter is of a tunable fifth-order Bessel type.

3. The tunable Bessel low pass filter as set forth in claim 2, wherein said variable capacitor/inductor controller includes:
    input setting means for presetting a reference value and a plurality of multiplication factors to be applied to the reference value;
    multiplication means including a plurality of multipliers for multiplying said reference value by said multiplication factors, respectively; and
    control signal output means for converting results of multiplication by said multiplication means into said capacitance/inductance control signals and outputting them respectively to said variable capacitors of said variable capacitor circuit and said variable inductors of said variable inductor circuit;
    whereby said variable capacitor/inductor controller controls said plurality of variable capacitors of said variable capacitor circuit and said plurality of variable inductors of said variable inductor circuit.

* * * * *